(12) United States Patent
Aspar et al.

(10) Patent No.: US 7,807,482 B2
(45) Date of Patent: Oct. 5, 2010

(54) METHOD FOR TRANSFERRING WAFERS

(75) Inventors: Bernard Aspar, Rives (FR); Chrystelle Lagahe-Blanchard, St-Joseph-de-Riviere (FR)

(73) Assignee: S.O.I.Tec Silicon On Insulator Technologies, Bernin (FR)

( * ) Notice: Subject to any disclaimer, the term of this patent is extended or adjusted under 35 U.S.C. 154(b) by 372 days.

(21) Appl. No.: 11/628,615

(22) PCT Filed: Jun. 2, 2005

(86) PCT No.: PCT/FR2005/050411

§ 371 (c)(1), (2), (4) Date: Feb. 4, 2008

(87) PCT Pub. No.: WO2005/124826

PCT Pub. Date: Dec. 29, 2005

(65) Prior Publication Data

US 2008/0254596 A1 Oct. 16, 2008

(30) Foreign Application Priority Data

Jun. 2, 2004 (FR) .................................. 04 51085

(51) Int. Cl.
*H01L 21/20* (2006.01)
(52) U.S. Cl. .............................. 438/15; 438/17; 438/20; 438/455; 438/458; 438/463; 257/E21.122; 257/E21.238; 257/E21.505; 257/E21.599; 257/E21.705
(58) Field of Classification Search ............. 438/15–20, 438/106–113, 455–485; 257/E21.122, 238, 257/505, 599, 705, E25.012
See application file for complete search history.

(56) References Cited

U.S. PATENT DOCUMENTS

| 5,534,328 | A | * | 7/1996 | Ashmead et al. ............ 428/166 |
| 5,641,416 | A | * | 6/1997 | Chadha .................. 219/121.69 |
| 5,656,552 | A | * | 8/1997 | Hudak et al. ................... 438/15 |
| 5,780,354 | A |   | 7/1998 | Dekker et al. ................ 438/459 |
| 5,804,086 | A | * | 9/1998 | Bruel ........................... 216/33 |
| 5,948,255 | A | * | 9/1999 | Keller et al. ............ 210/321.84 |
| 6,013,534 | A |   | 1/2000 | Mountain ..................... 438/15 |
| 6,027,958 | A |   | 2/2000 | Vu et al. |

(Continued)

FOREIGN PATENT DOCUMENTS

EP 1251557 A2 10/2002

(Continued)

OTHER PUBLICATIONS

French Preliminary Search Report, PCT/FR2005/050411, 7 pgs., (Nov. 15, 2005).

(Continued)

*Primary Examiner*—Michael S Lebentritt
(74) *Attorney, Agent, or Firm*—Nixon Peabody LLP

(57) ABSTRACT

The invention concerns a method for preparing a thin layer (28) or a chip to be transferred onto another substrate, this method including the realization, above the surface of said thin layer or said chip, of at least one layer, called adhesive layer (25), and of at least one layer, called first barrier layer (22), the adhesive layer being made of a material of which etching presents selectivity in relation to the material of the barrier layer.

60 Claims, 6 Drawing Sheets

U.S. PATENT DOCUMENTS

| | | | |
|---|---|---|---|
| 6,214,733 B1 | 4/2001 | Sickmiller | 438/691 |
| 6,593,229 B1 * | 7/2003 | Yamamoto et al. | 438/635 |
| 6,607,970 B1 | 8/2003 | Wakabayashi | |
| 6,653,206 B2 * | 11/2003 | Yanagita et al. | 438/458 |
| 6,846,698 B2 * | 1/2005 | O'Keefe et al. | 438/106 |
| 6,902,987 B1 * | 6/2005 | Tong et al. | 438/455 |
| 7,041,178 B2 * | 5/2006 | Tong et al. | 148/33.4 |
| 7,387,944 B2 * | 6/2008 | Tong et al. | 438/455 |
| 7,713,369 B2 * | 5/2010 | Asper et al. | 156/249 |
| 2002/0022343 A1 | 2/2002 | Nonaka | |
| 2002/0115263 A1 | 8/2002 | Worth et al. | 438/455 |
| 2003/0032294 A1 | 2/2003 | Gardes | 438/694 |
| 2003/0064579 A1 | 4/2003 | Miyakawa et al. | |
| 2004/0222500 A1 * | 11/2004 | Aspar et al. | 257/629 |
| 2005/0029224 A1 * | 2/2005 | Asper et al. | 216/33 |
| 2007/0072393 A1 * | 3/2007 | Aspar et al. | 438/459 |
| 2008/0128868 A1 * | 6/2008 | Aspar | 257/629 |
| 2008/0254596 A1 * | 10/2008 | Aspar et al. | 438/459 |

FOREIGN PATENT DOCUMENTS

| | | |
|---|---|---|
| FR | 2828579 A1 | 2/2003 |
| JP | 334610 | 12/1996 |
| JP | 08334610 | 12/1996 |

OTHER PUBLICATIONS

French Preliminary Search Report, FR 0451085; FA 650392, 4 pgs., (Dec. 17, 2004).

* cited by examiner

METHOD FOR TRANSFERRING WAFERS

CROSS REFERENCE TO RELATED APPLICATIONS OR PRIORITY CLAIM

This application is a national phase of International Application No. PCT/FR2005/050411 entitled "Method For Transferring Plates", which was filed on Jun. 2, 2005, which was not published in English, and which claims priority of the French Patent Application No. 04 51085 filed Jun. 2, 2004.

TECHNICAL FIELD AND PRIOR ART

The invention concerns the field of microelectronics and techniques implemented in this field to carry out a wafer or substrate transfer or to carry out processing of a wafer surface.

In this field of microelectronics, it is important in particular to be able to carry out transfers of thin layers containing circuits. These transfers of thin layers make it possible in particular to transfer the circuits on different wafers from those which served to develop them.

For example, these wafers may be fused silica wafers, wafers made of a semiconductor material which may or may not contain electronic components.

Several techniques may be used to transfer layers which have already been processed.

One technique, illustrated in FIGS. 1A-1D, consists of bonding a wafer 2 containing a processed layer 5 (for example, which contains circuits 3 and electrical contact pads 6: FIG. 1A) on a permanent wafer 8 (FIG. 1C).

Then, the part 1 of the initial wafer 2 not containing the processed area is eliminated, for example by grinding, mechanical or chemical-mechanical polishing or etching (dry or wet).

The surface of the wafer 5 containing the circuits and the contacts 6 then finds itself buried at the level of the bonding interface (FIG. 1D).

In some cases, it is necessary to have the surface of the wafer 5 at the level of the surface of the final structure: it is then necessary to perform a double transfer in order to return the processed surface upward. In this way, one may see the contact pads on the surface again and resume the contacts in a standard way.

The first transfer is done as above but, in this case, the wafer 5 with the circuits is first bonded on an intermediary wafer (wafer 8 in FIG. 1D), also called a "handle wafer".

The unnecessary part of the initial wafer is eliminated, for example by grinding, polishing or chemical etching.

Then, the thinned-down rear face of the processed layer is prepared to enable adhesion on a support 10, which may advantageously be the permanent support (FIG. 2A).

The handle 8 is then eliminated, for example by dismantling at the level of the bonding interface 12 or by mechanical and/or chemical elimination (FIG. 2B).

Bonding of wafers to one another may, for example, be done using bonding by molecular adhesion or using an adhesive substance 7 (FIG. 1B-1D), depending on the specifications for the method or final structures. If an adhesive substance is used, it may subsequently be eliminated.

The difficulty of bonding wafers with circuits resides in the presence of a topology on the surface of the layer 5, meaning differences between the levels e between the raised and low areas of this surface, which may correspond to several levels of metal in different areas or, more generally, to different lay ups of materials in different areas. These differences in level may reach a value in the vicinity of several μm, they are for example between 500 nm and 5 μm.

An adhesive or adhesive substance may be used to bond the wafers to one another. In this case, the adhesive or adhesive substance may be chosen with a viscosity which makes it possible to bond without being disturbed by the surface topology.

In the case of bonding by molecular adhesion, generally, a layer 4 of material is placed on the surface (FIG. 1A).

This layer is then flattened and bonded onto the intermediary wafer or the final support.

In the absence of such a layer 4, non-bonded areas may be present at the level of the bonding interface and interfere with the transfer of the thin layer.

In some cases, in particular when there is a double transfer (enabling, as explained in relation to FIGS. 2A and 2B, the processed surface to be returned toward the top of the final structure), the layer 4 used for adhesion must be eliminated locally to enable connection on the contact pads.

This is even more true in the case where, for example, the initial layer 5 with the circuits presents contact pads 6 initially open and where they must be reopened after the transfer (FIG. 3).

After transferring the processed layer onto its final support, lithography and etching operations are done to open the contacts 6 again.

However, these additional lithography and etching operations require the use of heavy-equipment.

They also make it necessary to have one or several lithography masks corresponding to the levels to be opened, which is not always the case.

Moreover, in some cases, these steps are not compatible with the permanent support on which the circuit must be transferred.

In other cases, one would like, after the step in FIG. 1D, to carry out processing, directly of the layer 5, on the side of the surface 9, but there is, in this case again, the problem of finding, after processing, the topology of the layer 5 on the side opposite the surface 9.

In still other cases, one would like, after the step in FIG. 1C, to carry out processing, directly from the support 1, for example after partial elimination of said support 1, but there is, in this case again, the problem of finding, after processing, the topology of the layer 5 on the side placed opposite this support 1.

Also, there is the problem of finding a new method making it possible to facilitate carrying out of the transfer of a layer which may contain circuits or components and/or which may present surface topology.

Preferably, if the layer initially contains surface contact pads, one seeks to find the contact pads open once again without performing a lithography operation.

DISCLOSURE OF THE INVENTION

To resolve this problem, the object of the invention is a method for preparing a thin layer or a chip to be transferred onto a substrate, this method including the realization, above the surface of said thin layer or said chip, of at least one layer, called adhesive layer, and at least one layer, called first barrier layer, between the adhesive layer and the surface of said thin layer of said chip, the adhesive layer being made of a material of which etching presents selectivity in relation to the material of the barrier layer, meaning of which the etch rate is higher than that of the barrier layer.

The thin layer or the chip may have a surface topology, therefore variations in height or level according to a direction perpendicular to a plane defined by the thin layer; these variations being able to have an amplitude between several nm and several μm.

The invention also concerns a process for transferring a thin layer or a chip onto a substrate, this thin layer or this chip being supported by a support wafer and presenting surface topology, therefore amplitude or level variations according to a direction perpendicular to a plane defined by the thin layer, this process including:

- the realization, above the surface of said thin layer or said chip, of at least one layer, called adhesive layer, and of at least one layer, called first barrier layer, the adhesive layer being made of a material of which etching presents selectivity in relation to the material of the barrier layer,
- the transfer of the thin layer or of the chip onto said substrate,
- the elimination of adhesive layers and of the first barrier layer, to find the initial topology again.

The transfer may include a prior assembly of the adhesive layer with a wafer or substrate, as well as the elimination of all or part of the support wafer or substrate.

The wafer or substrate may then be eliminated.

The invention also concerns a method for processing a thin layer or a chip, this thin layer or this chip being supported by a support wafer and presenting surface topology, therefore amplitude or level variations according to a direction perpendicular to a plane defined by the thin layer, this method including:

- the realization, above the surface of said thin layer or said chip, of at least one layer, called adhesive layer, and of at least one layer, called first barrier layer, the adhesive layer being made of a material of which etching presents selectivity in relation to the material of the barrier layer,
- an assembly of the adhesive layer with a handle wafer or substrate,
- an elimination of all or part of the support wafer, then:
- processing of the thin layer or of the chip from its side not assembled with said handle wafer or substrate,
- or processing of one face of the support wafer not assembled with the thin layer or the chip,
- the elimination of the handle wafer or substrate,
- the elimination of adhesive layers and of the first barrier layer, to find the initial topology again.

Processing of the thin layer or of the chip or of a face of the support wafer may include a step to deposit a metallic and/or lithographic and/or etched and/or ion implantation layer.

An adhesive layer is, for example, a layer made of an organic or mineral material which enables adhesion between two surfaces thanks to its surface properties (roughness, flatness, hydrophily) in the case of bonding by molecular adhesion or thanks to the very nature of the layer in the case of an adhesive substance.

The barrier layer may be made of a material of which etching presents selectivity in relation to the underlying material of this barrier layer.

In one variant, the first barrier layer may, for example, have a thickness between 10 nm and 500 nm and/or comply with the surface or have a thickness greater than 500 nm and be in compliance with the surface.

The surface of the thin layer or of the chip may include electrical contact zones.

The adhesive layer may, for example, be of a mineral type, for example made of silicon dioxide, or silicon nitride, or polysilicon, or of an organic type, such as a BCB polymer.

The material of the first barrier layer is preferably chosen in relation to the adhesive layer, such that etching of the adhesive layer presents selectivity in relation to the barrier layer.

This may, for example, be nitride (Si3N4) or amorphous silicon, the material of the adhesive layer being silicon oxide.

According to another example, the material of the first barrier layer may be oxide (SiO2) and the material of the adhesive layer may be silicon nitride (Si3N4).

The thin layer or the chip may be directly beneath the barrier layer.

At least one part of the surface of the thin layer or the chip may then be made of oxide or oxynitride or nitride, this part corresponding for example to a passivation layer. Another part may, for example, be made of metal, such as aluminum or copper, this other part then corresponding to contact zones.

A second barrier layer, or protective layer, may be present between the first barrier layer and the surface of the thin-layer or of the chip.

This second barrier layer is chosen such that the etching of the first barrier layer is selective in relation to this second barrier layer.

This second barrier layer may be made of a material of which the etching presents selectivity in relation to the material(s) on the surface of the thin layer or of the chip.

The presence of this barrier layer makes it possible to protect the materials of the surface to be transferred, in particular in the case where they are etched more quickly than the first barrier layer during removal of the latter.

Advantageously, two barrier layers make it possible to have a second barrier layer which is thinner than the first barrier layer; it will therefore be more easily removed without damaging the thin layer or the chip to be transferred.

The second barrier layer is thin with a thickness, for example, between 10 nm and 500 nm.

The second barrier layer may, for example, be made of silicon oxide (SiO2).

A method such as that described above may moreover include a step for preparation of the surface intended for bonding, for example a step for flattening the adhesive layer.

One particular case is that where the barrier layer is made up of the material(s) on the surface of the layer to be transferred.

The invention therefore also concerns a method for preparing a thin layer or a chip for transfer onto a substrate, the surface of which includes, for example, at least one layer of nitride (Si3N4) or silicon oxynitride and metallic contact pads, this method including the realization, above the surface of said thin layer or of said chip, of a layer, called adhesive layer, in a material of which etching presents high selectivity in relation to the underlying material(s).

The invention also concerns a method for transferring a thin layer or a chip containing a strong topology onto a first substrate, including a preparation method as described above, then the bonding of the adhesive layer of the thin layer or of the chip onto the first substrate.

This method may moreover include, after bonding onto the first substrate, the elimination of all or part of the rear zone of a wafer supporting the thin layer or the chip with strong topology.

This method may also include, after bonding onto the first substrate and after elimination of all or part of the rear zone of the wafer supporting the thin layer or the chip, processing including one or several technological steps; for example, this may involve depositing a metallic layer, or lithography and/or etching, or ion implantation.

The rear face of the thin layer or of the chip may then be assembled or bonded onto a second, final substrate, in which case the first substrate may be eliminated.

The invention also concerns a process for transferring a thin layer or a chip onto a substrate, this thin layer or this chip being supported by a support wafer and presenting a surface topology, therefore variations in height or level according to a direction perpendicular to a plane defined by the thin layer, the surface of this layer or of this chip including at least one layer of silicon nitride (Si3N4) or silicon oxynitride and metallic contact pads, this transfer method including:

the realization, above the surface of said thin layer or said chip, of at least one layer, called adhesive layer, in a material of which etching presents selectivity in relation to the nitride, the transfer of the thin layer or of the chip onto said substrate, the elimination of the adhesive layer to find the initial topology again.

The transfer may include a prior assembly of the adhesive layer with a handle wafer or substrate as well as the elimination of all or part of the support wafer.

Such a method may also include, after transfer onto the substrate, or after processing, the elimination of the handle wafer or substrate.

The invention also concerns a method for processing a thin layer or a chip, this thin layer or this chip being supported by a support wafer and presenting a surface topology, therefore height or level variations according to a direction perpendicular to a plane defined by the thin layer, the surface of this thin layer or of this chip including at least one layer of silicon nitride (Si3N4) or silicon oxynitride and metallic contact pads, this transfer method including:

the realization, above the surface of said thin layer or of said chip, of at least one layer, called adhesive layer, in a material of which etching presents selectivity in relation to the nitride;

an assembly of the adhesive layer with a handle wafer or substrate, an elimination of all or part of the support wafer, then:

processing of the thin layer or of the chip from its face not assembled with said handle wafer or substrate, or processing of one face of the support wafer not assembled with the thin layer or the chip, the elimination of the handle wafer or substrate, the elimination of the adhesive layer, to find the initial topology again.

The processing of the thin layer or of the chip, or of one face of the support wafer, may include a step for depositing a metallic layer and/or lithography and/or etching and/or ion implantation.

The bonding onto a substrate may be bonding by molecular adhesion (or molecular bonding), or may be done with the help of an adhesive substrate.

The thin layer or the chip may, among other characteristics, present a topology and/or have open contact pads.

This application is particularly interesting in the case where the contact pads are open before the transfer and where they must be opened again after the transfer of the layer onto its final support. In this case, the method moreover includes a step for elimination of the barrier layer(s) deposited earlier.

DETAILED DISCLOSURE OF PARTICULAR EMBODIMENTS

The invention will first be described in relation to FIG. 4A.

In this figure, one layer 28 is a layer containing one or several components (not shown in the figure) as well as contact pads 26 for these components. It rests on a substrate 24.

The component(s) may be of the electronic and/or optical circuit type, and/or of the microsystem type, one or several functionalities of the component(s) being the ability to be controlled by pads such as the pads 26.

Figure 1A:
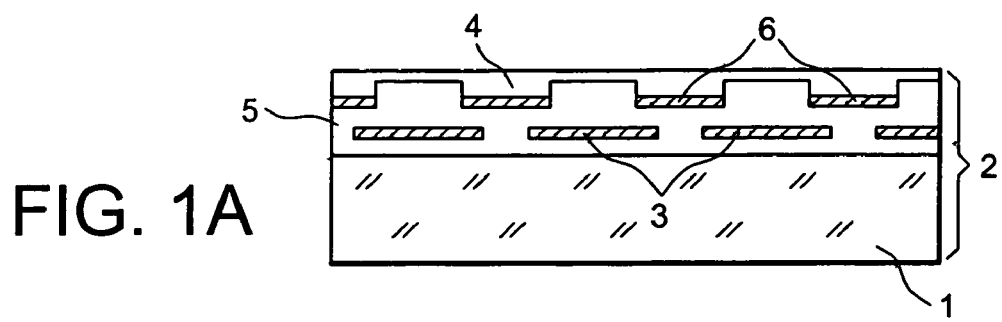
FIGS. 1A to 1D show steps in a known single transfer method.
Figure 1B:
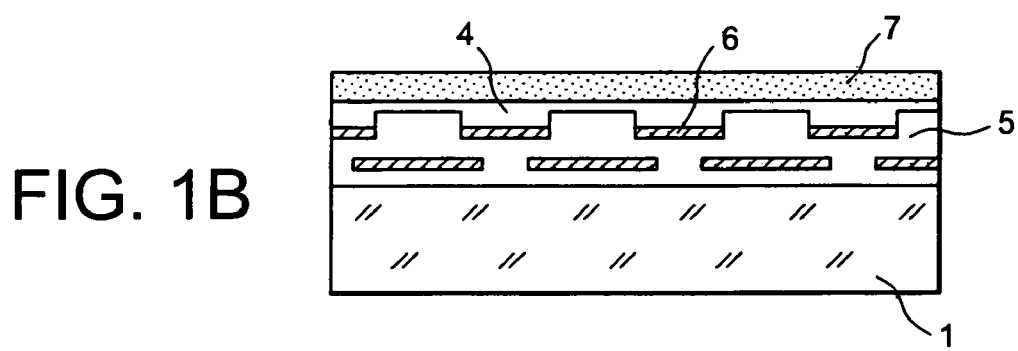
Figure 1C:
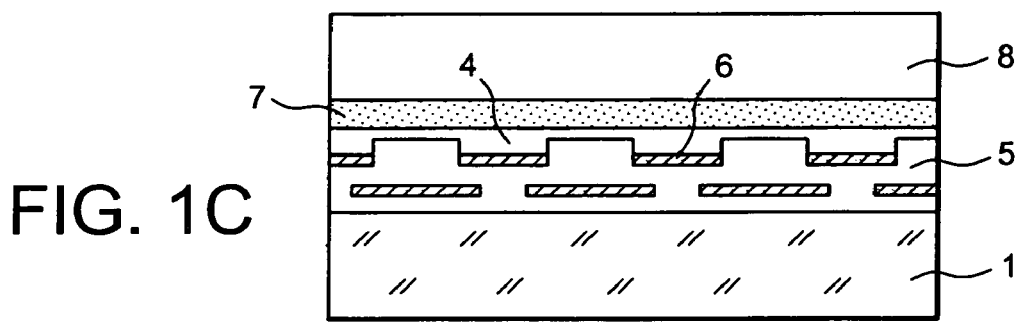
Figure 1D:
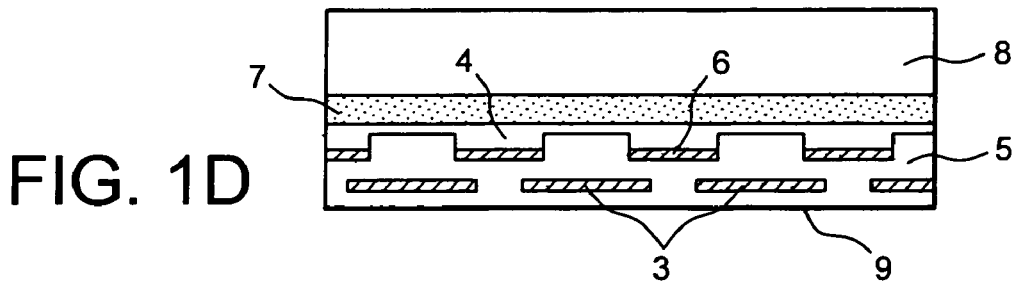
Figure 2A:
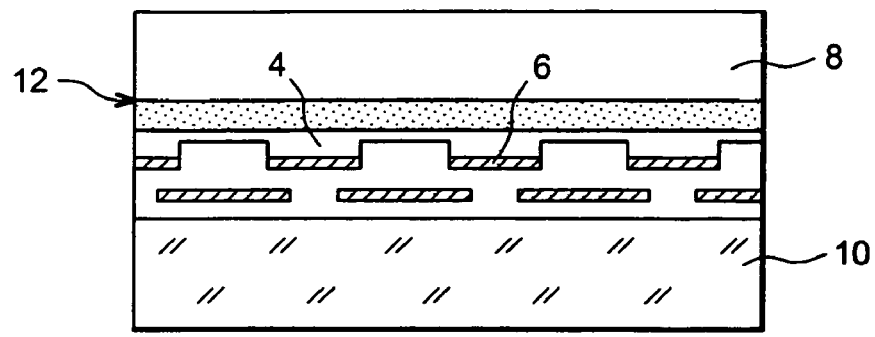
FIGS. 2A and 2B show the steps in a known double transfer method.
Figure 2B:
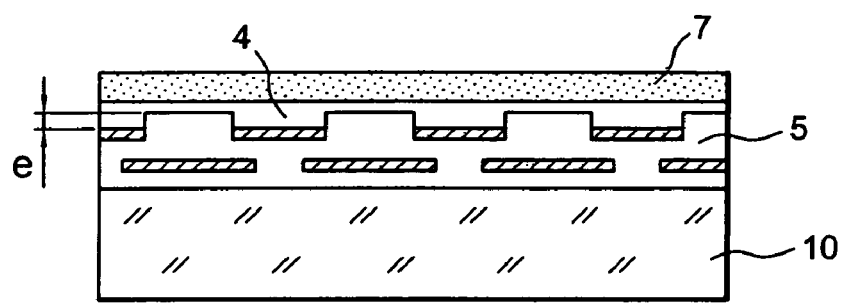
Figure 3:
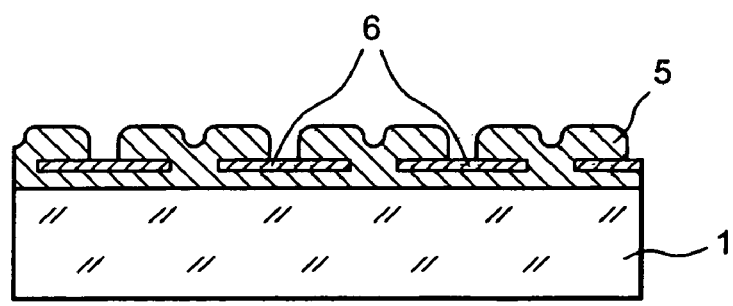
FIG. 3 shows a structure with a layer including circuits.
Figure 4A:
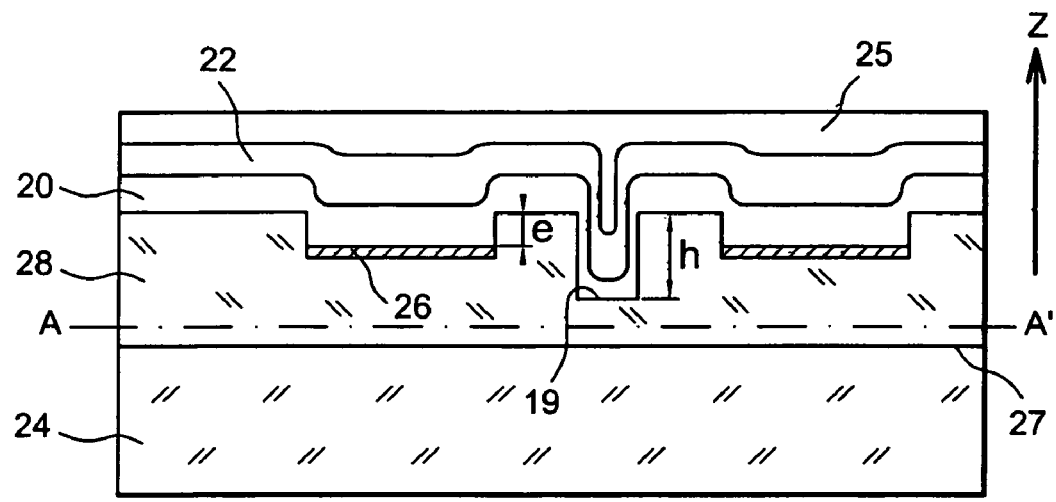
FIGS. 4A and 4B show steps in a method according to the invention.

The layer containing the components and the contact pads may present a surface topology, meaning differences in heights or levels between high and low areas of this surface, which correspond, for example, to several levels of metal or, more generally, to several levels in different zones in which different materials may be stacked (FIG. 4A).

These level differences may reach a value (following a direction z perpendicular to a plane defined by the layer 28 and shown by a sign AA' in FIG. 4A) in the vicinity of several µm; they are, for example, between several dozen nm and several µm, for example between 10 nm or 50 nm or 500 nm and 1 µm or 5 µm.

There are two types of level differences:

the level e between the top of the surface, and the level of the zones to be reopened (for example contact 26), and the level h between the top of the surface and the lowest point 19 of the surface (corresponding for example to the bottom of the scribe lines), which one may then try to take into account to define the thickness of the adhesive layer which will make it possible to obtain good flattening over the entire surface.

The invention is also applicable in the case where the surfaces are homogenous, for example in the case of a surface presenting zones none of which are metallic, these different zones presenting a surface topology, and therefore variations in height as explained above, and in particular in the ranges indicated above.

A first layer 20 is deposited on the surface of the processed wafer 28.

It may be designated by the expression "protective layer" and/or "second barrier layer": it is chosen such that it forms a barrier layer during etching of the surface layer 22 defined as the first barrier layer (see below). Advantageously, this layer 20 may also be chosen such that, at the time of its final removal (for example for opening of the contact pads 26 of components after transfer onto the final support), the etching processing (wet and/or dry, and/or mechanical and/or chemical) applied to it affects it very little or not at all, the surface materials of the layer 28 (including, in particular, metallizations at the level of the contact pads 26).

In a first variant, this first layer 20 is made up of a different material from that of the first barrier level and those present on the surface of the processed wafer 28 such that the etching processes to remove it are as less restricting as possible for the materials of the surface of the layer 28, which are therefore under the layer 20.

In other terms, the layer 20 is made of a material presenting characteristics of a barrier layer in relation to the first layer called barrier layer and of which etching is selective in relation to the material making up the wafer 28: etching or any technique for eliminating the layer 20 only affects the wafer 28 negligibly.

Generally, one calls selectivity the relationship between the etching rates of two materials, here between the materials of layers 20 and 28 (or 22 and 20, 25 and 22 as in the following). For example, the etching of a layer A presents selectivity in relation to another layer B if the ratio between the etching rates (etching rate of layer A/etching rate of layer B) is greater than 1.

One talks about high selectivity if this ratio is greater than 10 or between 10 and 1000 or even greater than 1000.

For an etching rate ratio between 10 and 2, the selectivity is referred to as moderate.

If this ratio is less than 2, but greater than 1, selectivity shall be called low.

In the examples provided above, one will consider the ratio between the etching rate of the layer 20 and the etching rate of the layer 28 or of the etching rate of the layer 22 and the etching rate of the layer 20, to determine whether one is in the presence of high, moderate or low selectivity.

Selectivity may be chosen according to the topology e between the high zones and the zones to be reopened. This is, for example, the case of the layer 25 for which etching must be selective in relation to the layer 22.

Table I below gives examples of typical etching rates for several materials and some etching solutions:

| | ETCHING SOLUTIONS | | | |
|---|---|---|---|---|
| | TMAH 25% 80° C. | HF 5% 20° C. | HF 50% 20° C. | H3PO4 160° C. |
| Si | ~500 nm/min | <0.5 nm/min | <1 nm/min | ~0.2 nm/min |
| SiO2 | <0.5 nm/min | 20-40 nm/min | ~500 nm/min | <0.1 nm/min |
| Si3N4 | <0.5 nm/min | ~0.8 nm/min | <20 nm/min | ~5 nm/min |

In a second variant, the protective layer is identical to a part of the surface of the layer 28 (for example a passivation part), it therefore constitutes an excessive thickness which may be removed, it is for example in $SiO_2$.

Generally, overetching of the layer 20 is also possible. One may overetch the layer 20 and thus etch the layer 28 a little without etching the metal 26.

For a wafer 28 in oxynitride or silicon nitride with aluminum contacts, the layer 20 is, for example, made of silicon dioxide ($SiO_2$).

This layer 20 may moreover have a low thickness, for example between 10 nm and 500 nm, such that it controls all etching processing of this layer 20 even better.

This limited thickness, between 10 nm and 500 nm, may also be sufficient to control etching of the layer 20, even if the material of which it is made is of a fairly similar nature to that of the material present on the surface of the layer 28. For example, the layer 20 may be a layer of SiO2 of a thickness between 10 nm and 100 nm, for example 50 nm, while the surface area of the layer 28 is also made of SiO2.

A second layer 22 makes up a layer called "barrier layer", called first barrier layer, with regard to a third layer 25, itself chosen for its bonding or adhesive qualities.

The etching properties of the layer 22 are different from those of the first layer 20, such that the layer 22 may later by eliminated by etching without the layer 20 being affected, or only superficially. There may even be overetching, meaning that the layer 20 may be slightly etched by the etching of the layer 22, without disappearing, though, even locally.

In other words, the layer 22 is chosen such that, at the time of its final removal, the etching treatments (wet and/or dry, and/or mechanical and/or chemical) do not, or only slightly affect the surface material of the layer 20, under the layer 22, or are as less restricting as possible for this underlying material of this layer 20.

Again in other words, the layer 22 is made of a material of which etching presents selectivity, for example at least >1.5, in the sense already explained above, in relation to the material making up the layer 20: etching or any technique for eliminating the layer 22 only affects the layer 20 negligibly affects it a little but not totally.

The layer 25 is chosen for its bonding qualities. This is, for example, a layer enabling bonding by molecular adhesion, for example a layer of SiO2. These adhesive properties may be reinforced by preparing the surface of this layer, for example by mechanical-chemical polishing, or by chemical and/or mechanical cleaning.

The thickness of this layer is preferably a function of h, meaning of the initial topology of the wafers. The thickness is for example 2×h to obtain good leveling and homogenous bonding.

The thickness of the first barrier level is preferably chosen according to the selectivity between the bonding layer and the first barrier layer, but also preferably according to e and the average thickness of the adhesive layer.

During elimination of this adhesive layer 25, the layer 22 is affected little or not at all.

According to one example, the layer 22 is made of silicon nitride, on a thin layer 20 of SiO2 (thickness from 10 nm to 100 nm), the bonding layer 25 being in SiO2 and the thin layer 28 also in SiO2 with, for example, aluminum contacts. This example will be explained in more detail below in relation to FIGS. 5A-5C.

Figure 4B:
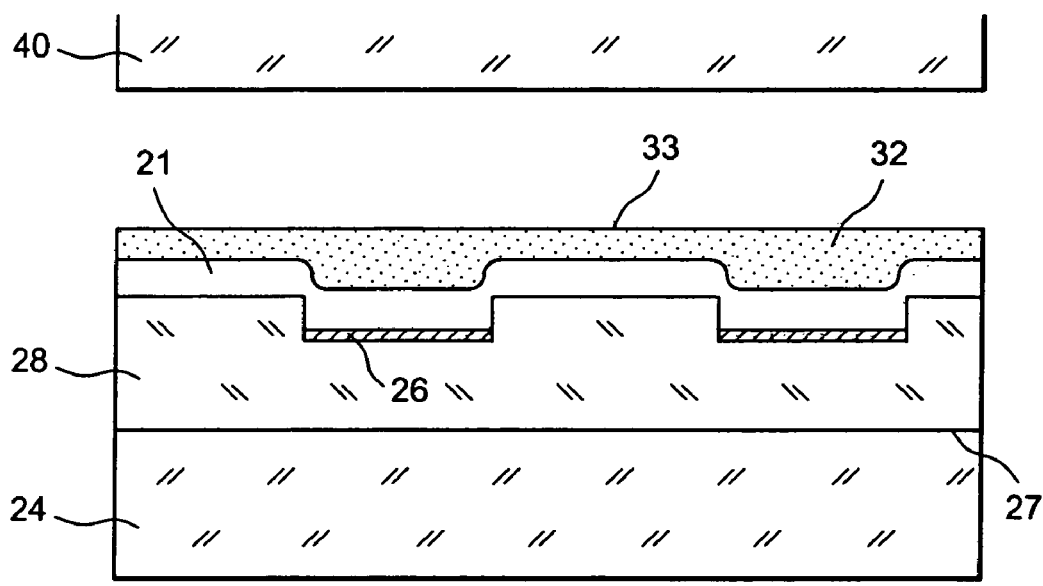

According to another embodiment of the invention, illustrated in FIG. 4B, one may place a first layer 21 on the surface of the layer 28 (corresponding to the first barrier layer).

This is, for example, a layer 21 of silicon nitride Si3N4, of a thickness between 10 nm and 100 nm.

Then, a second layer 32 of a second material may be deposited. This is a bonding layer. This second material does not have the same physical properties as the material of the layer 21, the latter playing the role of barrier layer in relation to all etching solutions of the layer 32.

The etching properties of the layer 32 are therefore different from those of the first barrier layer 21, such that the layer 32 may later be eliminated by etching without the layer 20 being affected, or only superficially.

In other words, the layer 32 is chosen such that, at the time of its final removal, the etching treatments (wet or dry and/or chemical or mechanical-chemical) do not, or only slightly affect the underlying material, on the surface of the layer 21, or are as less restricting as possible for the underlying material of this layer 21.

In other words, the layer 32 is made of a material of which etching presents selectivity, in the sense already explained above, in relation to the material making up the layer 21: etching or any technique for eliminating the layer 32 only affects the layer 21 negligibly. There may even be overetching, meaning that the layer 21 may be slightly etched or eliminated by the etching of the layer 32, but without disappearing, even locally.

This second layer 32 is, for example, made of SiO2 (oxide). This may also be a polymer-type adhesive substance (resin, BCB . . . ).

If the characteristics of the deposited layers 21, 32 are not compatible with direct molecular bonding (which is the case if leveling is insufficient, and/or if the roughness of the surface is high . . . ), one may carry out a mechanical-chemical leveling step, followed by cleaning, of the surface 33 before bonding of the treated wafer onto a substrate 40, for example a handle wafer or substrate.

According to this other embodiment, the etching selectivity of the layer 32 in relation to the layer 21 makes it possible subsequently to eliminate this layer 32 without etching layer 21, then to etch, in a second step, this layer 21, the limited nature and/or thickness of which ensure control of the etching. There is therefore no risk of damaging wafer 28.

According to another example, layer 21 is made of amorphous silicon and layer 32 of silicon dioxide, for a layer 28 made of silicon oxide, or of silicon oxynitride, or of silicon nitride. The layer 21 then acts as a barrier layer, and again the role of protective layer during later etching of the adhesive layer 32.

Figure 5A:
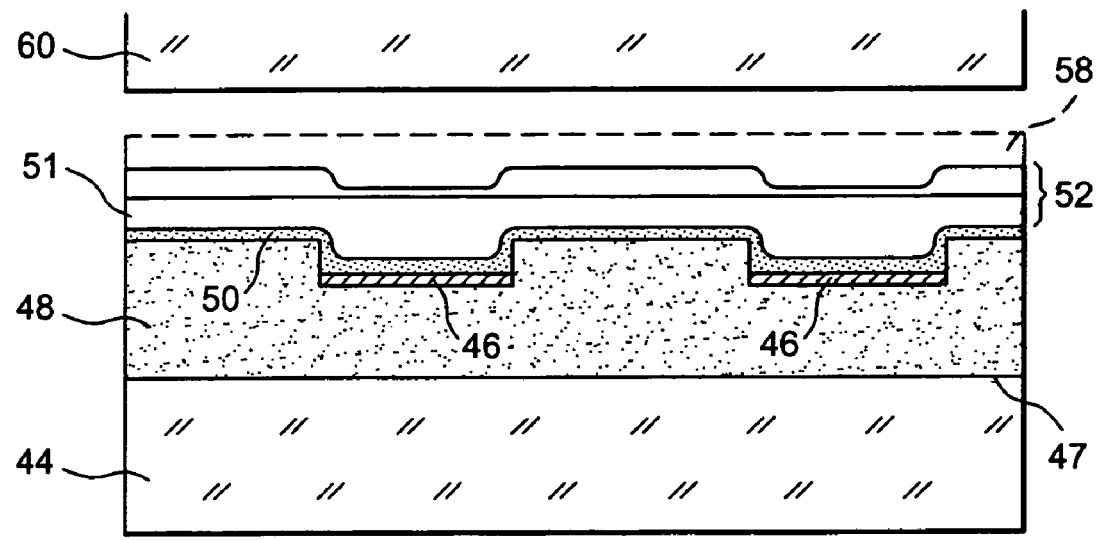
FIGS. 5A-5C show steps in a second method according to the invention.
Figure 5B:
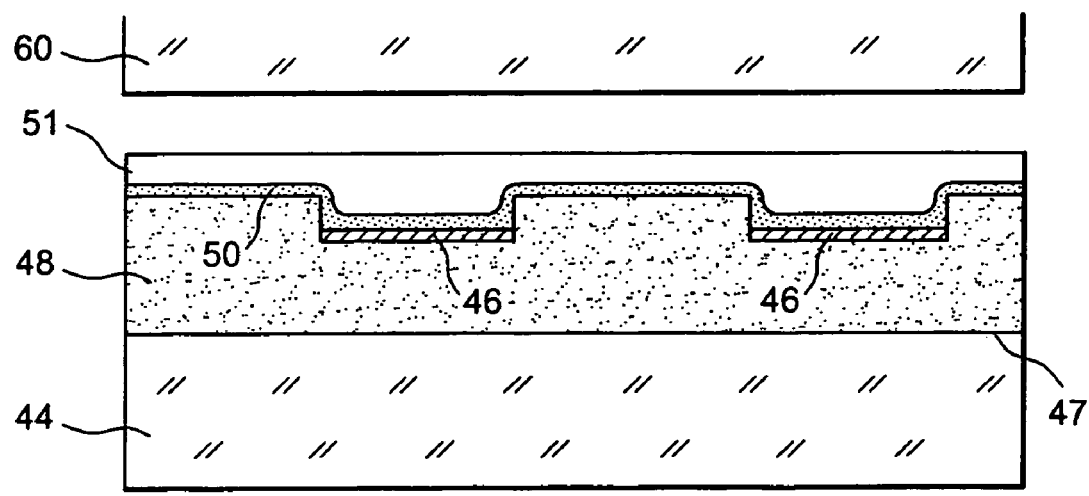
Figure 5C:
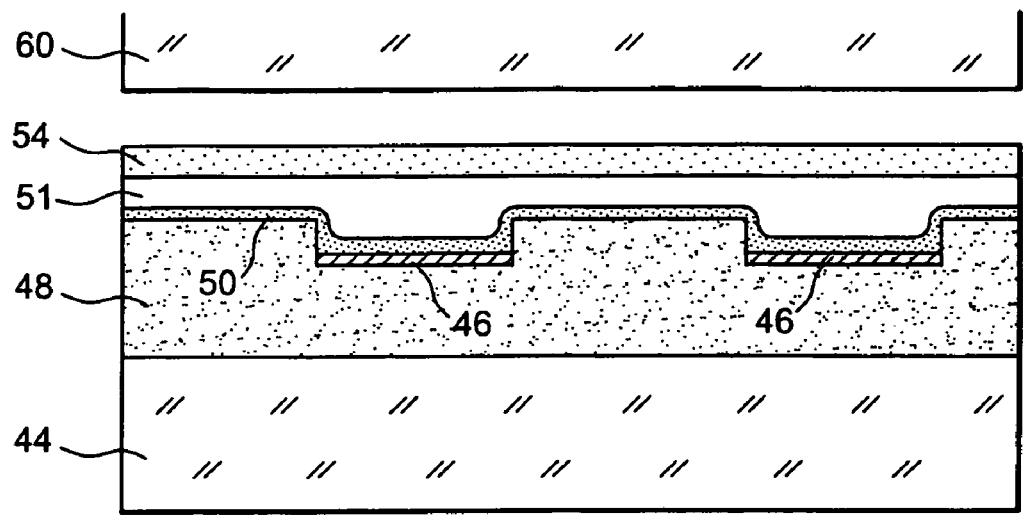

According to an example of embodiment of the invention, illustrated in FIG. 5A-5C, one may successively place a layer 50, called protective layer, and second barrier layer, for example made of SiO2, of low thickness (between, for example, 50 nm and 100 nm), then a barrier layer 52 of nitride (Si3N4), and this even if the surface of the wafer 48 is also made of SiO2.

The selectivity of the etching of Si3N4 in relation to SiO2 is such that it is possible to etch layer 52 without etching the thin oxide layer 50 too much.

The latter layer being thin, it may easily be removed in a controllable way, with little or no risk of etching wafer 48 or metallic pads 46.

The layer 52 may be flattened so as to leave only one part called the sub-layer 51 with a flat surface (FIG. 5B).

It is possible, in order to reinforce bonding onto another substrate 60, for example a handle wafer or substrate, that an additional layer 54 for bonding, or favoring adhesion, in particular aimed at molecular adhesion, for example a layer of SiO2, is added onto sub-layer 51 (FIG. 5C).

An additional bonding layer 58, for example a layer of SiO2, may also be directly added on the unflattened layer 52 (as illustrated in FIG. 5A) in order to prepare, and in particular to carry out flattening of, the whole for bonding, in particular for molecular adhesion, with a substrate 60.

Such an additional layer 54 or 58 makes it possible to limit the thickness of the layer 51 or 52 and only having subsequently to eliminate, for example by etching, a limited thickness of this layer 51 or 52. This later operation may thus be done in a very well-controlled manner, without any risk of damaging the layer 50 or the wafer 48.

The use of a third layer 54, 58 may in particular be of interest when the etching selectivity is not sufficient between the first two layers 50 and 51, or if flattening of the second layer is not sufficient for molecular adhesion.

This variant may also be advantageous in the case where the second layer 52 laid down is itself not very suited to bonding.

As already explained above, the additional bonding layer 54, 58 presents etching properties which enable it to be selectively eliminated in relation to the layer 51, 52, the latter then playing the role of barrier layer during the etching step.

The structure is then bonded onto another wafer 40 or 60, for example a handle wafer or substrate. The bonding technique may in particular use molecular bonding (case of FIG. 5B) or use an adhesive substance such as layer 25, 32 of FIG. 4A or 4B or layer 54, 58 of FIG. 5A or 5C.

Thermal treatment may also be done in such a way as to reinforce the bonding strength.

Substrate 24 or 44 bearing the thin layer to be transferred is then eliminated, for example by mechanical and/or chemical means, for example by grinding, mechanical-chemical polishing or TMAH etching.

The thinned rear face 27 or 47 of the processed layer 28 or 48, bonded on its handle wafer or substrate 40 or 60, is then prepared so that it is attached on its final support.

The preparation means may, for example, be chosen among mechanical-chemical polishing, chemical, mechanical cleaning.

After bonding of this rear face 27 or 47 onto the permanent substrate (for example, such as a glass or silicon or sapphire substrate or a substrate chosen for its thermal, electrical (insulating or conductive) or optical properties or a semiconductor substrate, processed or not, containing or not, all or part of an electronic and/or optical and/or mechanical component), for example by molecular adhesion, or using an adhesive substance (glue, resin, . . . ), the handle wafer or substrate 40 or 60 may be eliminated.

To strengthen bonding, certain later treatments, such as thermal treatment, may be done.

The elimination of the handle wafer or substrate 40, 60 may be done with the same methods used to eliminate all or part of the initial substrate 24, 44 or by means enabling dismantling of the handle wafer or substrate.

Preferably, this dismantling may be done at the level of the bonding interface between the circuit wafer substrate 40, 60 and the surface of the thin layer 28, 48 to be transferred.

Then, once this layer 28, 48 has been transferred, layers 20, 21, 22, 25, 32, 50, 51, 52, 54, 58 which were placed on the surface are progressively eliminated by different means, such as, for example, plasma etching and/or chemical etching in liquid or gaseous phase, and/or ion etching, and/or etching and/or mechanical-chemical polishing.

The interest of having a multi-layer deposit is that one may etch successively, and individually and in a controlled manner, the different layers without inducing damage in the contacts 26, 46 and the surface of the wafer 28, 48, protected by the first deposited layer 20, 21, 50. This layer will be eliminated last without affecting the surface of the layer 48, as already explained above.

Figure 6:
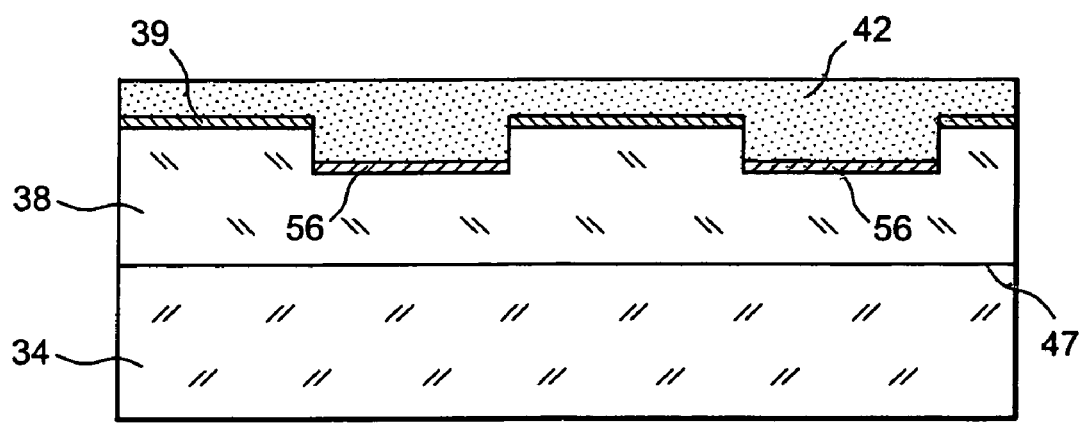
FIG. 6 illustrates a third method according to the invention.

According to another example of application illustrated in FIG. 6, the substrate 38 to be transferred includes, on its surface, a layer 39 of silicon nitride (Si3N4) or silicon oxynitride and/or metallic contact pads 56, for example in copper or aluminum.

A bonding layer 42 which, in the case of molecular adhesion, is for example made of silicon dioxide SiO2 or, in the case of an adhesive layer, of BCB polymer is formed directly on the wafer 38.

More generally, one may form, on a substrate 38 to be transferred, a layer 42 in a material presenting, during its etching, selectivity in relation to materials 39, 56 on the surface of layer 38, which makes it possible to ensure elimination of this adhesive layer 42 without risk for wafer 38 and therefore nor for the material 39, nor for the contacts 56.

The transfer is then done as already described above, for example on a handle wafer or substrate, then on a permanent substrate in the case of a double transfer.

It is then possible to eliminate the layer 42 by etching and without risk for either the surface 39 or for the pads 56.

The invention therefore also concerns a method for transferring thin layers, in particular of the type containing strong topology, to be found again after a transfer, this process including:

a) the realization of an adhesive layer or a stack of several layers, called barrier layers, as described above, on the surface of the thin layer, b) the bonding of the adhesive layer or the Stack, and therefore of the thin layer, onto a support wafer or substrate (such as, for example, wafer 40, 60 of FIGS. 4B-5C).

If this support wafer is temporary, the method may also include:

the elimination of all or part of the rear zone of a wafer (such as, for example, wafer 24, 34, 44 in FIGS. 4A-6) supporting the thin layer with the strong topology, the bonding of the rear face of the thin layer onto a final support, the elimination of the temporary support wafer or substrate, the elimination of the adhesive layer or the multi-layer stack to find the initial topology again, which enables the properties of the adhesion layer or of the stack, done in accordance with the invention according to one of the embodiments exposed above in relation to FIGS. 4A-6.

Figure 7A:
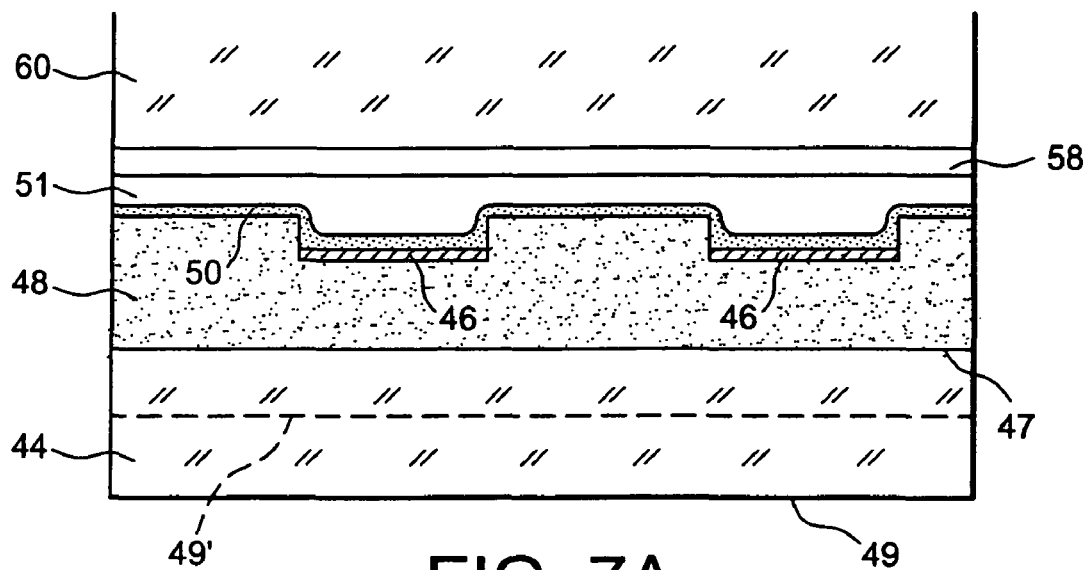
FIGS. 7A and 7B show steps in another method according to the invention.
Figure 7B:
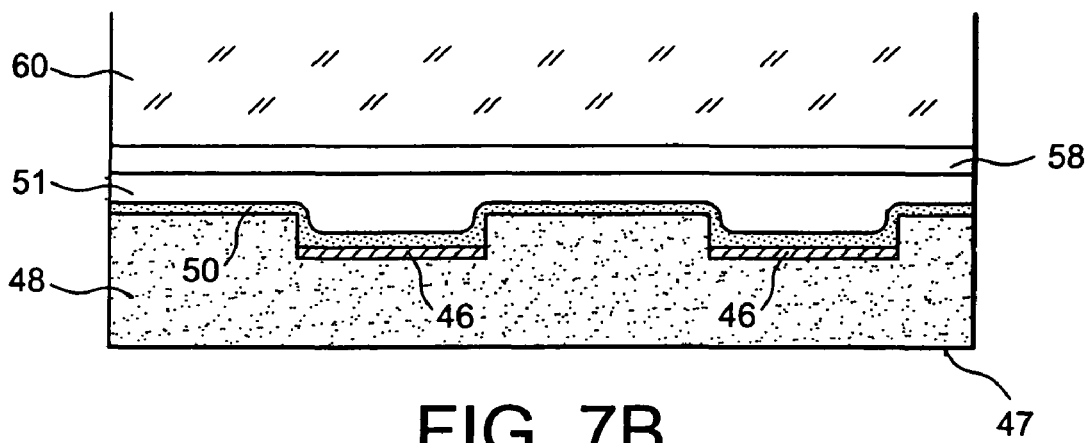

In one variant, and still in the hypothesis where the support wafer or substrate is temporary, the method may moreover include, after steps a) and b) above:

processing of the surface 49 of a wafer supporting the thin layer with the strong topology; this case is shown in FIG. 7A, where the references are taken from FIG. 5A and where the support 60 is shown assembled with the whole made up of the substrate 44, the chip 48 and the stack 50-51, and where the processing will be that of the wafer 44, from its surface 49. Processing may also be done form a surface 49' after partial elimination of the substrate 44; processing may, for example, include a step for depositing a metallic layer and/or one or several steps for lithography/etching and/or one or several steps for ion implantation and/or cleaning and/or thinning down;

or an elimination of this wafer 44 supporting the thin layer or the chip 48 and processing of this thin layer or of this chip; this case is shown in FIG. 7B, with the same notations as FIG. 7A; the support 44 is eliminated and the chip may be processed from its surface 47.

One may then proceed with the elimination of the temporary support wafer or substrate 60, then the multi-layer stack 50-51.

In the various cases disclosed above, the multi-layer stack will be preferable, as it makes it possible to obtain a flat surface compatible with bonding by molecular adhesion onto a support wafer, in particular an intermediary support or substrate, such as the wafer 60.

Moreover, as explained above, the layers of the stack are chosen for their different etching properties, a lower layer serving as a barrier layer during elimination of the layer immediately above it.

Such an implementation facilitates the final removal of the layers to find the contacts again.

The multi-layer stack may include at least one layer of silicon nitride as a barrier layer.

The adhesive layer may, for example, be a layer of silicon oxide.

The methods according to the invention are also applicable in the case of a transfer of objects with small dimensions, such as "chips", for example.

In the methods described above, the adhesive or intermediary layers may be obtained by a PECVD- or LPCVD-type deposit.

One example of embodiment concerns a processed wafer (for example on an SOI substrate), components or circuits being located in the thin layer with a surface made of Si having open contact zones (in aluminum: Al) and passivation zones (in silicon nitride: SiN). The maximum topology h measured on the surface of this wafer is, for example, 2 μm (between the highest zones and the lowest zones, for example at the level of the scribe lines). As already indicated above, one preferably chooses the thickness of the adhesive layer according to h to obtain good flattening and homogenous bonding over the entire surface.

The difference in height e between the highest zones and the contact zones to be reopened may be different from h. For example, let us consider here that it is 1 μm.

According to the diagram in FIG. 4A, one may form, according to one embodiment of the invention, a stack of this type:

layer 20 called "protective" (on the processed surface): made of $SiO_2$ TEOS, or Tetraethyl-Orthosilicate, obtained, for example, by PECVD, with a thickness of 50 nm, layer 22 called "barrier" (on the layer 20): made of SiN, obtained, for example, by PECVD, with a thickness of 500 nm, layer 25 called "adhesive" (on the layer 22): in $SiO_2$ TEOS, which may also be obtained by PECVD, with a thickness of 4 μm.

The layer 25 is then flattened and cleaned to be bonded onto a handle, wafer or substrate. A thermal treatment at low temperature (for example 200° C.) may advantageously be done in order to strengthen the bonding interface. The rear face 24 of the processed wafer may be thinned down by mechanical grinding, then etching until reaching the oxide layer buried in the SOI substrate. The surface of this oxide is then prepared and bonded on a fused silica substrate. Thermal strengthening processing may be done, for example at 200° C. The handle wafer or substrate will then be eliminated (for example by mechanical grinding and chemical etching).

One then finds, on the surface, the flattened layer 25, layer 22, layer 20 and finally the initial surface of the wafer with open contact zones and passivation zones. The layer 25 (called "adhesive") may be eliminated chemically (for example, by HF treatment at 25% and/or BOE 30/1). Let us recall that the objective here is to eliminate the adhesive layer up to the level of the contact zones (level e), not necessarily to the lowest level of the topology (level h: for example the scribe lines). The layer 22 then acts as the barrier level for the removal of the layer 25 (selectivity in the vicinity of 3 to 5): it may be slightly etched during this step (for example, over a thickness of around 200 nm). The layer 22 (which is preferably in accordance with the initial surface) may then be eliminated by $H_3PO_4$ etching (at 160° C.); the layer 20 called "protective" plays the role of barrier layer (selectivity ~10) during removal of the layer 22 and of the protective layer in relation to the underlying materials (the processed layer). Lastly, the layer 20 (in accordance with the surface) is removed by rapid immersion in a chemical bath (for example BOE ("Buffered Oxide Etch") 30/1) or by plasma etching.

Another example concerns a wafer (for example bulk or massive Si substrate) which is processed and has open contact zones (copper: Cu) and passivation zones (silicon oxide: $SiO_2$). The maximum topology h measured on the surface of this wafer is, for example, 3 μm (between the highest zones and the lowest zones, for example the scribe lines). The difference in height e between the highest zones and the contact zones to be reopened may be different from h, for example, let us consider here that it is 500 nm.

One may thus form, according to another embodiment of the invention, a stack of the type of that in FIG. 4B:

layer 21 called "protective and barrier" (on the processed surface): in SiN, thickness 200 nm, layer 32 called "adhesive" (on the layer 21): in SiO2, TEOS, for example obtained by PECVD, thickness 5 μm.

The layer 32 will then be flattened and cleaned to be bonded onto a wafer or a substrate. A thermal treatment at low temperature (for example 300° C.) may advantageously be done in order to strengthen the bonding interface. The rear face 24 of the processed wafer 28 may then be thinned down by mechanical grinding, then mechanical-chemical polishing to a final thickness of the transferred layer of 6 μm. The surface 27 of the Si substrate 28 is then prepared and bonded onto a fused silica substrate. Thermal strengthening processing may be done, for example at 200° C. The "circuit wafer" substrate 40 will then be eliminated (for example, by processing using mechanical grinding and chemical etching).

One then finds, on the surface, the flattened layer 32, the layer 21 and lastly the initial surface of the wafer with open contact zones and passivation zones. The layer 32 (called "adhesive") may be eliminated chemically (for example, by HF treatment at 50% and/or BOE 30/1). Let us recall that the objective here is to eliminate the adhesive layer up to the level of the contact zones (level e) and not necessarily to the lowest level of the topology. The layer 21 then acts as the barrier level (selectivity in the vicinity of 3 to 5) for the removal of the layer 32: it may be slightly corroded during this step (over a thickness of for example, approximately 120 nm). The layer 21 (which is conformal with the initial surface) may then be eliminated by dry etching: the selectivity of certain methods may be >10 in relation to the underlying materials (processed layer: here Cu and SiO2).

Lastly, table II below provides some examples of possible combinations of materials in the case of a structure such as that of FIG. 4A.

The invention claimed is:

1. Method for transfer onto a substrate of a thin layer or of a chip, this thin layer or this chip being supported by a support wafer and presenting a surface topology, therefore variations in height or level according to a direction perpendicular to a plane defined by the thin layer, this method including:
   the realization, above the surface of said thin layer or said chip, of at least one layer, called adhesive layer, and of at least one layer, called first barrier layer, the adhesive layer being in a material of which etching presents selectivity in relation to the material of the barrier layer,
   the transfer of the thin layer or of the chip onto said substrate,
   elimination of adhesive layers and of the first barrier layer, to find the initial topology again.

2. Method according to claim 1, the transfer including a prior assembly of the adhesive layer with a handle substrate, as well as the elimination of all or part of the support wafer.

3. Method according to claim 2, further comprising the elimination of the handle substrate.

4. Method according to claim 1, the first barrier layer being made of a material of which etching presents selectivity in relation to the material beneath this barrier layer.

5. Method according to claim 1, the first barrier layer having a thickness between 10 nm and 500 nm and/or conformal with the surface of said thin layer or of said chip or with a thickness greater than 500 nm and is conformal with the surface of said thin layer or said chip.

6. Method according to claim 1, the variation(s) in level being between 10 nm and 5 μm.

7. Method according to claim 1, the surface of the thin layer or of the chip including electrical contact zones.

8. Method according to claim 1, the adhesive layer being of a mineral type.

|  | Examples | | | | | |
|---|---|---|---|---|---|---|
|  | 1 | 2 | 3 | 4 | 5 | 6 |
| Material of the adhesive layer 25 | SiO$_2$ | SiO$_2$ | SiO$_2$ | SiO$_2$ | SiO$_2$ | Polymer (BCB) |
| Material of the barrier layer 22 | SiN | SiN | SiN | SiN | Amorphous Si | SiN |
| Material of the protective layer 20 | SiO$_2$ | SiO$_2$ | SiO$_2$ | SiO$_2$ | SiO$_2$ | SiO$_2$ |
| Material 26 / Material 28 | Al / SiN | Al / SiON | Al / SiO$_2$ | Cu / SiO$_2$ | Al / SiO$_2$ | Al / SiO$_2$ |

|  | Examples | | | | | |
|---|---|---|---|---|---|---|
|  | 7 | 8 | 9 | 10 | 11 | 12 |
| Material of the adhesive layer 25 | SiO$_2$ | SiN | SiO$_2$ | SiO$_2$ | SiO$_2$ | Adhesive substance (epoxy for example) |
| Material of the barrier layer 22 | Amorphous Si | SiO$_2$ | Polymer (BCB) | SiN | — | SiO$_2$ |
| Material of the protective layer 20 | SiO$_2$ | — | — | — | — | — |
| Material 26 / Material 28 | Cu / SiO$_2$ | Al / SiO$_2$ | Al / SiO$_2$ | Cu / SiO$_2$ | Al / SiN | Al / SiO$_2$ |

9. Method according to claim 1, the adhesive layer being made of silicon dioxide.

10. Method according to claim 1, the adhesive layer being of an organic type.

11. Method according to claim 1, the adhesive layer being made of BCB-type polymer, or of an adhesive substance.

12. Method according to claim 1, the material of the first barrier layer being made of nitride (Si3N4) or amorphous silicon and the material of the adhesive layer of silicon oxide (SiO2).

13. Method according to claim 1 the material of the first barrier layer being oxide ($SiO_2$) and the material of the adhesive layer being silicon nitride (Si3N4).

14. Method according to claim 1, the thin layer or the chip being directly beneath the barrier layer.

15. Method according to claim 14, at least one part of the surface of the thin layer or of the chip being made of an oxide or of an oxynitride or of a nitride.

16. Method according to claim 15, at least one other part of the surface of the thin layer or of the chip including contact zones.

17. Method according to claim 1, a second barrier layer, or protective layer, being present between the first barrier layer and the surface of the thin layer or of the chip.

18. Method according to claim 17, said second barrier layer being made of a material of which etching presents selectivity in relation to the surface material of the thin layer or of the chip.

19. Method according to claim 18, said second barrier layer having a thickness between 10 nm and 500 nm.

20. Method according to claim 17, said second barrier layer being made of silicon oxide (SiO2).

21. Method according to claim 1, further including a preparation step of the surface for bonding.

22. Method according to claim 1, further including the possible elimination of a second barrier layer.

23. Method according to claim 1, said bonding onto the first substrate and/or onto the second substrate being molecular bonding.

24. Method according to claim 1, the selectivity or selectivities being between 2 and 10 or between 10 and 1000 or greater than 1000.

25. Method for processing of a thin layer or of a chip, this thin layer or this chip being supported by a support wafer and presenting a surface topology, therefore variations in height or in level according to a direction perpendicular to a plane defined by the thin layer, this method including:
  realization, above the surface of said thin layer or said chip, of at least one layer, called adhesive layer, and of at least one layer, called first barrier layer, the adhesive layer being in a material of which etching presents selectivity in relation to the material of the barrier layer,
  an assembly of the adhesive layer with a handle substrate,
  elimination of all or part of the support wafer, then:
  processing of the thin layer or of the chip from its face not assembled with said handle substrate,
  or processing of a face of the support wafer not assembled with the thin layer or the chip,
  elimination of the handle substrate,
  elimination of adhesive layers and of the first barrier layer, to find the initial topology again.

26. Method according to claim 25, the processing of the thin layer or of the chip or of a face of the support wafer including a step for depositing a metallic layer and/or a lithography step and/or an etching step and/or an ion implantation step and/or a cleaning step and/or a thinning step.

27. Method according to claim 25, the first barrier layer being made of a material of which etching presents selectivity in relation to the material beneath this barrier layer.

28. Method according to claim 25, the first barrier layer having a thickness between 10 nm and 500 nm and/or conformal with the surface of said thin layer or of said chip or with a thickness greater than 500 nm and is conformal with the surface of said thin layer or said chip.

29. Method according to claim 25, the variation(s) in level being between 10 nm and 5 µm.

30. Method according to claim 25, the surface of the thin layer or of the chip including electrical contact zones.

31. Method according to claim 25, the adhesive layer being of a mineral type.

32. Method according to claim 31, the adhesive layer being made of silicon dioxide.

33. Method according to claim 25, the adhesive layer being of an organic type.

34. Method according to claim 33, the adhesive layer being made of BCB-type polymer, or of an adhesive substance.

35. Method according to claim 25, the material of the first barrier layer being made of nitride (Si3N4) or amorphous silicon and the material of the adhesive layer of silicon oxide (SiO2).

36. Method according to claim 25, the material of the first barrier layer being oxide ($SiO_2$) and the material of the adhesive layer being silicon nitride (Si3N4).

37. Method according to claim 25, the thin layer or the chip being directly beneath the barrier layer.

38. Method according to claim 37, at least one part of the surface of the thin layer or of the chip being made of an oxide or of an oxynitride or of a nitride.

39. Method according to claim 37, at least one other part of the surface of the thin layer or of the chip including contact zones.

40. Method according to claim 25, a second barrier layer, or protective layer, being present between the first barrier layer and the surface of the thin layer or of the chip.

41. Method according to claim 40, said second barrier layer being made of a material of which etching presents selectivity in relation to the surface material of the thin layer or of the chip.

42. Method according to claim 40, said second barrier layer having a thickness between 10 nm and 500 nm.

43. Method according to claim 40, said second barrier layer being made of silicon oxide (SiO2).

44. Method according to claim 25, further including a preparation step of the surface for bonding.

45. Method according to claim 25, further including the possible elimination of a second barrier layer.

46. Method according to claim 25, said bonding onto the first substrate and/or onto the second substrate being molecular bonding.

47. Method according to claim 25, the selectivity or selectivities being between 2 and 10 or between 10 and 1000 or greater than 1000.

48. Method for transfer onto a substrate of a thin layer or a chip, this thin layer or this chip being supported by a support wafer, and presenting a surface topology, therefore variations in height or level according to a direction perpendicular to a plane defined by the thin layer, the surface of this layer or of this chip including at least one layer of silicon nitride (Si3N4) or silicon oxynitride and metallic contact pads, this transfer method including:

the realization, above the surface of said thin layer or of said chip, of at least one layer, called adhesive layer made of a material of which etching presents selectivity in relation to the nitride, the transfer of the thin layer or of the chip onto said substrate, elimination of the adhesive layer to find the initial topology again.

49. Method according to claim 48, the transfer including prior assembly of the adhesive layer with a handle substrate, as well as the elimination of all or part of the support wafer.

50. Method according to claim 49, including, after transfer onto the substrate, the elimination of the handle substrate.

51. Method according to claim 48, further including the possible elimination of a second barrier layer.

52. Method according to claim 48, said bonding onto the first substrate and/or onto the second substrate being molecular bonding.

53. Method according to claim 48, the selectivity or selectivities being between 2 and 10 or between 10 and 1000 or greater than 1000.

54. Method according to claim 48, the adhesive layer being made of silicon dioxide or polymer.

55. Method for processing a thin layer or a chip, this thin layer or this chip being supported by a support wafer, and presenting a surface topology, therefore variations in height or level according to a direction perpendicular to a plane defined by the thin layer, the surface of this layer or of this chip including at least one layer of silicon nitride (Si3N4) or silicon oxynitride and metallic contact pads, this transfer method including:

the realization, above the surface of said thin layer or of said chip, of at least one layer, called adhesive layer, made of a material of which etching presents selectivity in relation to the nitride, assembly of the adhesive layer with a handle substrate, elimination of all or part of the support wafer, then:

processing of the thin layer or of the chip from its face not assembled with said handle wafer, or processing of a face of the support wafer not assembled with the thin layer or the chip, elimination of the handle wafer, elimination of the adhesive layer, to find the initial topology again.

56. Method according to claim 55, the processing of the thin layer or of the chip, or of a face of the support wafer, including a step for depositing a metallic layer and/or a step of lithography and/or en etching step and/or an ion implantation and/or a cleaning step and/or a thinning step.

57. Method according to claim 55, the adhesive layer being made of silicon dioxide or polymer.

58. Method according to claim 55, further including the possible elimination of a second barrier layer.

59. Method according to claim 55, said bonding onto the first substrate and/or onto the second substrate being molecular bonding.

60. Method according to claim 55, the selectivity or selectivities being between 2 and 10 or between 10 and 1000 or greater than 1000.

* * * * *